United States Patent [19]

Seki

[11] Patent Number: 4,464,585
[45] Date of Patent: Aug. 7, 1984

[54] GATE CIRCUIT OF GATE TURN-OFF THYRISTOR

[75] Inventor: Nagataka Seki, Tokyo, Japan

[73] Assignee: Tokyo Shibaura Denki Kabushiki Kaisha, Kawasaki, Japan

[21] Appl. No.: 525,262

[22] Filed: Aug. 22, 1983

Related U.S. Application Data

[63] Continuation of Ser. No. 242,158, Mar. 9, 1981, abandoned.

[30] Foreign Application Priority Data

Mar. 27, 1980 [JP] Japan .................... 55-38186

[51] Int. Cl.³ ............................. H03K 17/72
[52] U.S. Cl. ..................... 307/252 C; 307/252 J; 307/263; 307/268
[58] Field of Search ............ 307/252 C, 252 H, 252 J, 307/252 L, 305, 263, 268; 328/67

[56] References Cited

U.S. PATENT DOCUMENTS

| | | | |
|---|---|---|---|
| 3,681,677 | 8/1972 | Badal | 307/268 |
| 3,772,532 | 11/1973 | Petrov et al. | 307/268 |
| 3,787,738 | 1/1974 | Horwath | 307/268 |
| 4,203,047 | 3/1978 | Seki | |

FOREIGN PATENT DOCUMENTS

| | | |
|---|---|---|
| 2044751 | 9/1970 | Fed. Rep. of Germany . |
| 120581 | 5/1975 | German Democratic Rep. . |
| 53-102662 | 2/1977 | Japan . |

OTHER PUBLICATIONS

IEEE IAS Annual Mtg. Conference Record pp. 1088-1098, T. Jinzenji et al., "Three Phase Static Power Supplies for Air-Conditioned Electric Coaches Using High Power GTO".

Primary Examiner—John Zazworsky
Attorney, Agent, or Firm—Oblon, Fisher, Spivak, McClelland & Maier

[57] ABSTRACT

A gate circuit of a gate turn-off thyristor has first and second circuit means. The first circuit means consists of a diode, a pulse transformer with a voltage dividing point in the primary section, and a switching element. The transformer provides a pulse current of a large rising rate between the cathode and gate of the thyristor when the switching element is closed and also provides a pulse current of a smaller falling rate between the cathode and gate when the switching element is open. The second circuit means consists of at least a single capacitor, which is connected between the voltage dividing point of the transformer and a d.c. power supply feeding an electrical power to the two circuit means so as to produce a higher voltage than that of the power supply at one end of the primary section, which is blocked by the diode from the power supply, when the switching element is open, and so as to discharge down to a lower voltage than that of the power supply at one end of the primary section when the switching element is closed.

11 Claims, 12 Drawing Figures

F I G. 6
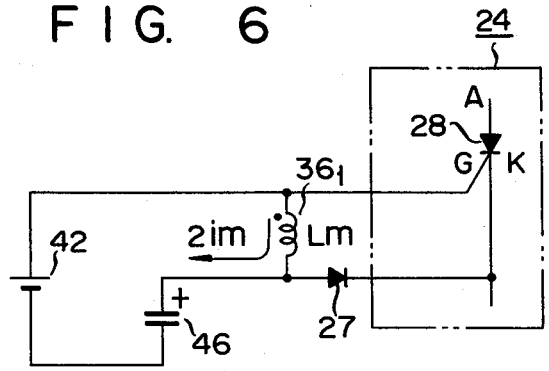
F I G. 7
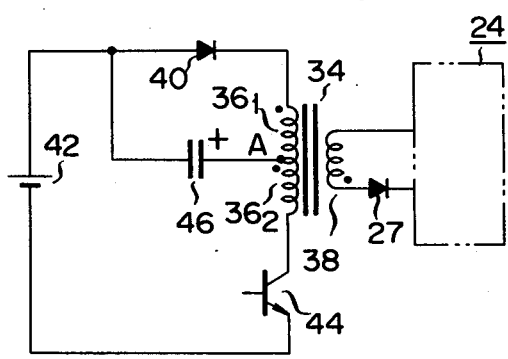
F I G. 8
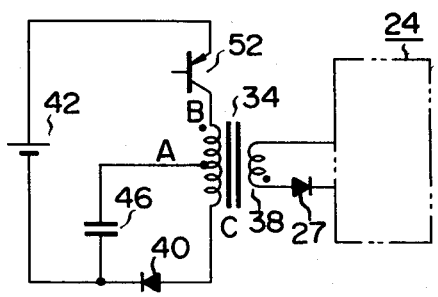

GATE CIRCUIT OF GATE TURN-OFF THYRISTOR

This application is a continuation of application Ser. No. 242,158, filed Mar. 9, 1981, abandoned.

The present invention relates to a gate circuit of a gate turn-off thyristor, more particularly to improvements in power consumption and the falling rate of pulse current supplied to the thyristor.

It is generally known that the conduction region inside a thyristor gradually extends from the vicinity of the gate of the thyristor when a pulse is impressed on the gate to turn on the thyristor. If an anode current with high (di/dt) is caused to flow into the thyristor immediately after the thyristor is turned on, the thyristor will be broken with its anode locally heated. Accordingly, (di/dt) of the anode current is limited to a predetermined level. On the other hand, a gate current with high (dIG/dt) is conventionally supplied to the gate of the thyristor immediately after the thyristor is turned on, as shown in FIG. 1. This is done because switching loss will be increased to break the thyristor if (dIG/dt) is small. In a circuit including a number of series- or parallel-connected thyristors, moreover, variations in the turn-on time of the thyristors may be reduced by using the gate pulse shown in FIG. 1.

FIG. 2 shows a prior art gate circuit to provide such a pulse. Referring now to FIG. 3 as well as FIG. 2, the operation of this circuit will be described. When a transistor 10 is turned on, a capacitor 12, which is not charged initially, is caused to conduct when the voltage E of a d.c. power supply 14 is impressed across the capacitor 12. As a result, the voltage E of the power supply 14 is applied to a primary winding 18 of the pulse transformer 16, and a voltage of E/n is induced at a secondary winding 20, as shown in FIG. 3. Black spots marked at the primary and secondary windings 18 and 20 represent the positive polarity of voltages induced at these windings. Further, n is given by $$n = \frac{\text{Number of turns of primary winding}}{\text{Number of turns of secondary winding}}$$

As the capacitor 12 is charged, the voltage impressed across the primary winding 18 decreases gradually. The steady-state value of the voltage across the primary winding 18 may be given by $$\text{Steady-state value} = E \times \frac{R_2}{R_1 + R_2}$$

where $R_1$ is the resistance value of a resistor 22 and $R_2$ is the resistance value of a load 24 expressed in terms of the primary winding. An example of the load 24, shown in FIG. 2 is formed of a thyristor 28 whose gate is connected through a diode 26 to the positive polarity end of the secondary winding 20 and whose cathode is connected to the other end of the winding 20. When the transistor 10 is then turned off, an exciting current which has so far been flowing through the primary winding 18 cannot immediately be reduced to zero, and a circulating current continues to flow through a closed circuit formed of the primary winding 18, a Zener diode 30 and a diode 32 until energy stored in the exciting inductance of the pulse transformer 16 becomes zero. Electric charges on the capacitor 12 are used up by a closed circuit of the capacitor 12 and the resistor 22 and reduced to zero. FIG. 3 shows the waveform of a voltage induced on the secondary side in response to the aforementioned operation on the primary side. Since the Zener voltage of a Zener diode 30 of the aforesaid closed circuit is $E_{ZD}$, an inverse voltage ($E_{ZD}/n$) as shown in FIG. 3 is induced at the secondary winding 20 the moment the transistor 10 is turned off. However, the negative voltage is negligible because it is cut off by the diode 26 connected to the load 24. Accordingly, the gate circuit shown in FIG. 2 can provide a gate pulse of substantially the same waveform as shown in FIG. 1. The aforementioned circuit, however, has the following drawbacks.

(1) Energy stored in the exciting inductance of the pulse transformer 16, energy with which the capacitor 12 is charged, and energy used up by the resistor 22 all constitute an energy loss.

(2) The pulse transformer 16 need additionally include the circuit to consume the stored energy in the exciting inductance, that is, the circuit of the Zener diode 30 and the diode 32. If the transistor 10 is turned on before the stored energy in the pulse transformer 16 becomes zero, the stored energy is accumulated to saturate the core of the pulse transformer 16, so that no energy can be transmitted to the load 24. Accordingly, the pulse transformer 16 is so designed that the transistor 10 is turned on after the stored energy becomes zero.

(3) When the voltage induced at the secondary winding 20 is very quickly inverted from positive to negative, as shown in FIG. 3, an inverse current caused by inverse recovery charges in the diode 26 connected to the load 24 may sometimes cause a malfunction of the load 24. Where the gate circuit shown in FIG. 2 is applied to an off gate circuit of a GTO (gate turn-off) thyristor, for example, the GTO thyristor will again be turned on after it is turned off by an off gate current with a peak value of 200 A, if an inverse current of only 1/1,000 of such an off gate current or of 0.2 A flows through the thyristor. It has therefore been impossible to use the prior art circuit as an off gate circuit for the GTO thyristor.

The degree of the energy loss stated in Item (1) is 10 W/device for a firing circuit of the thyristor, and approximately 100 W/device for the off gate circuit of the GTO thyristor. As a result, the energy loss of Item (1) may sometimes account for 5% to 10% of the total loss of an apparatus using the GTO thyristor. Since it is necessary to use the circuit to consume the stored energy, as described in Item (2), the gate circuit becomes bulky to prevent miniaturization of the apparatus.

Accordingly, the object of the present invention is to provide a gate circuit of a GTO thyristor improved in loss, compactness, and reliability.

In order to achieve the object, the gate circuit according to the invention comprises a first circuit means connected between the cathode and gate of a thyristor so as to cause a pulse current of a large rising rate and smaller falling rate to flow between the cathode and gate of the thyristor, and a second circuit means connected to the first circuit means so as to be charged up to a voltage larger in absolute value than that of a d.c. power supply and to be discharged down to a voltage smaller in absolute value than that of the d.c. power supply in synchronism with the operation of the thyristor.

This invention will be more fully understood from the following detailed description when taken in conjunction with the accompanying drawings, in which:

FIG. 6 is the equivalent circuit of the circuit according to the invention when being charged; and FIGS. 7 to 12 are circuit diagrams showing second to seventh embodiments of the invention respectively.

Figure 1:
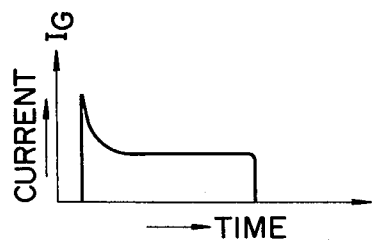
FIG. 1 shows a waveform of a gate pulse current to a thyristor.
Figure 2:
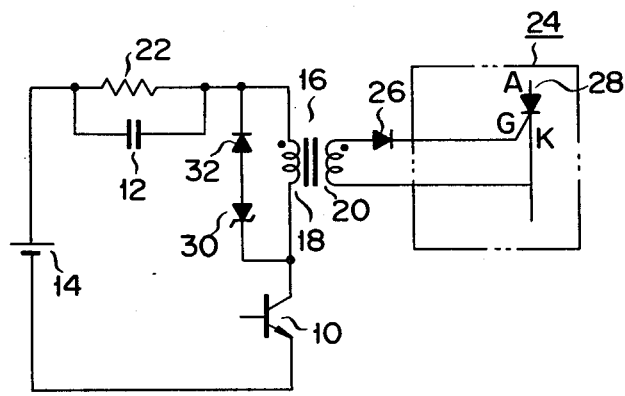
FIG. 2 is a circuit diagram showing a prior art gate circuit.
Figure 3:
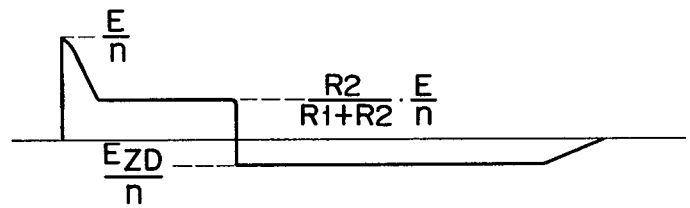
FIG. 3 is a graph showing a waveform involved in the turn-on process of the gate circuit.
Figure 4:
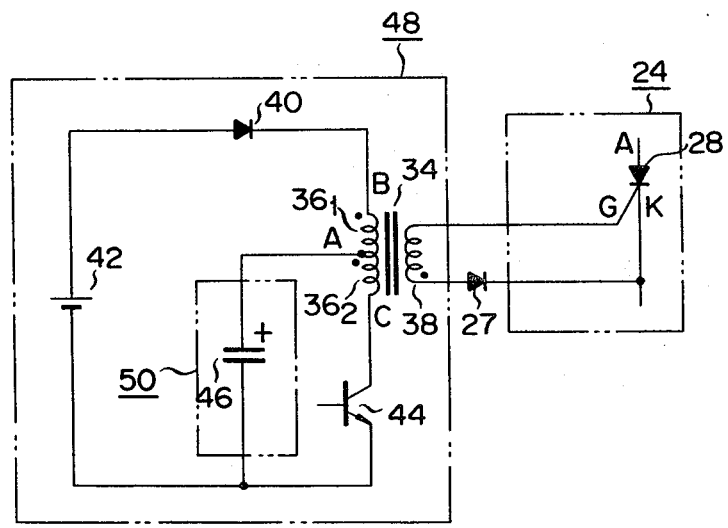
FIG. 4 is a circuit diagram showing the basic circuit construction according to a first embodiment of the present invention.

In all the Figures, like parts are designated by like reference numerals. FIG. 4 shows a first embodiment of the invention which will now be described. A pulse transformer 34 includes a primary winding 36 having a first primary winding section $36_1$ and a second primary winding section $36_2$ bordered by a tap terminal A, and a secondary winding 38. Black spots marked at the primary and secondary windings 36 and 38 represent the positive polarity of voltages induced between these windings. One end of the primary winding 36 is connected through a diode 40 to the positive terminal of a d.c. power supply 42. The other end of the primary winding 36 is connected through an NPN transistor 44 to the negative terminal of the power supply 42, so that a current flows from the collector of the transistor 44 connected to the other end of the primary winding 36 to the emitter connected to the negative terminal of the power supply 42 when the transistor 44 is turned on. The positive polarity end of the secondary winding 38 is connected through a diode 27 to the cathode of a thyristor 28, while the other end of the winding 38 is connected to the gate of the thyristor 28. The thyristor 28 forms a load 24 as shown in FIG. 2. The base of the NPN transistor 44 is connected to a control circuit (not shown), and subjected to on-off control in response to the operation of the load 24. The pulse transformer 34, diode 40, d.c. power supply 42, diode 27, and NPN transistor 44 constitute a first circuit means 48. A capacitor 46 is connected between the tap terminal A of the pulse transformer 34 and the negative terminal of the power supply 42 to form a second circuit means 50.

Now there will be described the operation of the circuit shown in FIG. 4. The circuit is so designed that there is a relationship $Ec > E$ in a steady-state where E and Ec are the voltages of the d.c. power supply 42 and the capacitor 46 respectively, as mentioned later. Here let us suppose that the numbers of turns of the first and second primary sections $36_1$ and $36_2$ are equal, and that the ratio between the numbers of turns of each primary winding section $36_1$ or $36_2$ and the second winding 38 is given by $n_1$. When the NPN transistor 44 is turned on at time $t_0$, the voltage Ec of the capacitor 46 is impressed on both ends A and C of the second primary winding section $36_2$. Since the tap terminal A is located in the middle of the primary winding 36, the voltage induced at the first primary winding section $36_1$ is doubled, and the voltage at point B becomes 2Ec. Thus, since $2Ec > E$ is obtained so that the diode 40 is inversely biased, current flow from the d.c. power supply 42 is prevented. At the same time, a voltage of $Ec/n_1$ is induced at the secondary winding 38 (point F of FIG. 5). Thereafter, the capacitor 46 is discharged with a time constant of $CR_3$ between times $t_0$ and $t_1$ where $R_3$ is the resistance value of the load 24 in terms of the first or second winding section $36_1$ or $36_2$ and C is the capacitance of the capacitor 46 (between points F and G of FIG. 5). Since the relationship between the voltage Ec of the capacitor 46 and the voltage E of the d.c. power supply 42 during such period is given by $Ec > E/2$, the diode 40 is inversely biased.

When the voltage across the capacitor 46 is reduced to a half of the voltage of the d.c. power supply 42, i.e. E/2, and the voltage at point B is at the point of becoming lower than E, the diode 40 is forwardly biased to be turned on. As a result, the voltage E of the d.c. power supply 42 is impressed on the primary winding 36 of the pulse transformer 34, so that the voltage of the secondary winding 38 becomes $E/2n_1$ between times $t_1$ and $t_2$ (between points G and H of FIG. 5). Since the voltage Ec of the capacitor 46 is $Ec \approx E/2$ during such period, the diode 40 is forwardly biased.

Figure 5:
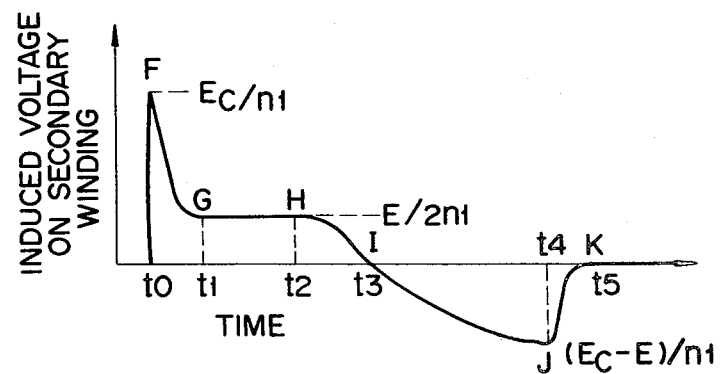
FIG. 5 is a graph showing the gate turn-on voltage in the circuit according to the invention.

Subsequently, when the transistor 44 is turned off at time $t_2$, the capacitor 46 is recharged to the polarity as shown in FIG. 4. FIG. 6 shows the equivalent circuit obtained at this time. The first and second primary winding sections $36_1$ and $36_2$ of the pulse transformer 34 are closely coupled together, and the magnetic flux of the pulse transformer 34 cannot immediately change. Accordingly, when the transistor 44 is turned off, the exciting current to flow through the second primary winding section $36_2$ immediately becomes zero, whereas the exciting current to flow through the first primary winding section $36_1$ becomes 2im obtained as a result of superposition of two equal currents im that have so far been flowing severally through the first and second primary winding sections $36_1$ and $36_2$. Then, the capacitor 46 is charged by the current 2im. It is evident from the equivalent circuit shown in FIG. 6 that most of the exciting energy is stored in the capacitor 46 without being used up by the thyristor 28 since the thyristor 28 is off and the gate-cathode impedance becomes high. In this case, if the inductance of the first primary winding section $36_1$ is Lm, the capacitor 46 can be charged up to approximately twice the voltage E of the d.c. power supply 42 ($Ec \approx 2E$) by a resonance current which depends on Lm and the capacitance C of the capacitor 46. As may be seen from the equivalent circuit of FIG. 6, the circuit between points G and K is substantially shorted when the thyristor 28 of the load 24 is on, so that the inductance of the pulse transformer 34 is in the order of several microhenries. When the thyristor 28 is off, on the other hand, the inductance Lm is connected in series with the capacitor 46, so that the inductance of the pulse transformer 34 is in the high order of several millihenries. As shown in FIG. 5, therefore, the induced voltage rises sharply up to $Ec/n_1$ at the time of discharge or at time $t_0$, while it falls slowly between times $t_2$ and $t_4$ (between points H and J of FIG. 5). After reaching a negative maximum depending on a value $(Ec-E)/n_1$ which is obtained by dividing the difference $(Ec-E)$ between the voltage Ec of the capacitor 46 and the voltage E of the d.c. power supply 42 by the turn ratio $n_1$, the induced voltage is reduced to zero potential between times $t_4$ and $t_5$ (between points J and K of FIG. 5). Between points H and I, the voltage of the capacitor 46 is smaller than E, so that a charging current flows into the capacitor 46 through the diode 40. Between points I and K, the voltage of the capacitor 46 is larger than E, but the charging current through the diode 40 flows until the exciting energy in the first primary winding section $36_1$ becomes zero.

Thus, the effects obtained according to this embodiment are as follows:

(A) The capacitor 46 is charged with stored energy of the pulse transformer 34, and then the NPN transistor 44 is turned on so that the energy is supplied to the load 24. Substantially, therefore, the energy loss is zero, and the aforementioned drawback (1) of the prior art circuit can be obviated.

(B) Since heat generating parts are eliminated and the number of parts used is reduced by the effect of Item (A), the device can be miniaturized. Practically, the device can be reduced to nearly half the size of the prior art device shown in FIG. 2. Thus, the aforementioned drawback (2) of the prior art device can be obviated.

For this reason, the recovery current of the diode 27 becomes substantially zero, there being no risk that the GTO thyristor 28 will erroneously fire. Thus, the aforementioned drawback (3) of the prior art device can be eliminated.

Although the numbers of turns of the first and second primary winding sections $36_1$ and $36_2$ are equal in the above-mentioned embodiment, the turn ratio may be changed to vary the ratio between the initial voltage $Ec/n_1$ applied to the load 24 and the steady-state voltage (flat portion between points G and H of FIG. 5) $E/2n_1$. Since the voltage of the capacitor 46 greatly increases if the circuit of FIG. 4 is operated without connecting the load 24 thereto, a high resistor or non-linear resistor as a dummy load may be connected across the capacitor 46 or in parallel with the diode 40.

FIG. 7 shows a second embodiment of the invention which differs from the first embodiment of FIG. 4 in the location of the capacitor 46. In FIG. 7, the capacitor 46 is connected at one end to a tap terminal A of a primary winding 36 of a pulse transformer 34 and at the other end to the positive terminal of a d.c. power supply 42.

The second embodiment of FIG. 7 is operated in the same manner and hence with substantially the same effect as the first embodiment of FIG. 4 except a difference in the charging voltage of the capacitor 46.

FIG. 8 shows a third embodiment of the invention which uses a PNP transistor in place of the NPN transistor 44 as a switching element. One end of a pulse transformer 34 is connected through a PNP transistor 52 to the positive terminal of a d.c. power supply 42. The collector and emitter of the PNP transistor 52 are connected to the one end of the pulse transformer 34 and the positive terminal of the d.c. power supply 42, respectively. The other end of the pulse transformer 34 is connected through a diode 40 to the negative terminal of the d.c. power supply 42 so as to prevent inverse biasing and impression of inverse voltage when the absolute value of a negative voltage induced at the other end of the pulse transformer 34 becomes greater than that of the negative voltage of the d.c. power supply 42. Other connections are the same as those of the first embodiment of FIG. 4.

First, let us suppose that a capacitor 46 is negatively charged, that the voltage at a tap terminal A is lower than the voltage at the negative terminal of the d.c. power supply 42, and that the diode 40 is inversely biased. When the PNP transistor 52 is turned on under those conditions, a charging current flows from the d.c. power supply 42 through the transistor 52 to the negatively charged capacitor 46, thereby producing a great induced voltage at a secondary winding 38 of the pulse transistor 34 (point F of FIG. 5). It can be considered that, in this process, a negative discharge current flows into the positive terminal of the d.c. power supply 42. Such charging is continued until the capacitor 46 is reduced to a voltage of approximately zero to cause the diode 40 to be forwardly biased (between points F and G of FIG. 5). After the diode 40 is forwardly biased, a current flows through the transistor 52, pulse transformer 34 and diode 40 to induce a constant voltage as indicated between points G and H of FIG. 5 at the secondary winding 38. Subsequently, when the transistor 52 is turned off, the capacitor 46 is negatively charged by the resonance current depending on the exciting inductance Lm between points A and C of the pulse transformer 34 and the capacitance C of the capacitor 46 (between points H and K of FIG. 5). As a result, the diode 40 is reversely biased.

As described above, the construction and operation of the third embodiment are essentially the same as those of the first embodiment shown in FIG. 4, the same effect can be obtained with use of the third embodiment.

Figure 9:
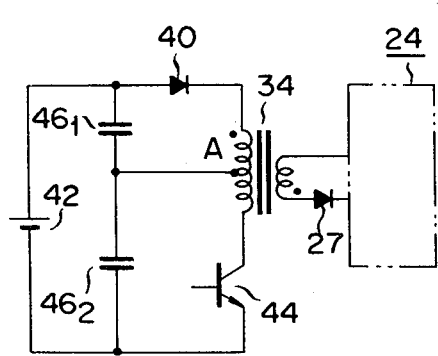

FIG. 9 shows a fourth embodiment of the invention which differs from the first embodiment of FIG. 4 in that a second circuit means is formed of a series circuit of a first capacitor $46_1$ and a second capacitor $46_2$, and a tap terminal A of a pulse transformer 34 is connected to the junction of the first and second capacitors $46_1$ and $46_2$.

The same effect of the first embodiment can be obtained with use of the fourth embodiment since the equivalent circuits of these embodiments are substantially the same.

Figure 10:
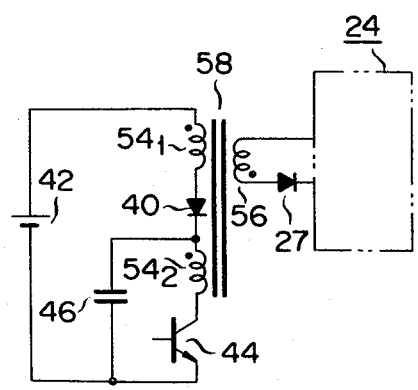

FIG. 10 shows a fifth embodiment of the invention which differs from the first embodiment of FIG. 4 in that a pulse transformer 58 has a first primary winding $54_1$, a second primary winding $54_2$, and a second winding 56, and in that a diode 40 is connected between the first and second primary windings $54_1$ and $54_2$. Having the same equivalent circuit as the first embodiment, this fifth embodiment can provide the same effect as that of the first embodiment.

Figure 11:
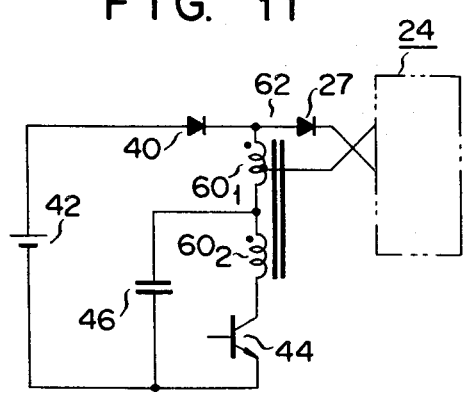

FIG. 11 shows a sixth embodiment of the invention which differs from the first embodiment of FIG. 4 in that a pulse transformer 62 has a first primary winding $60_1$ and a second primary winding $60_2$, and in that a load 24 is connected to the first primary winding $60_1$. Having substantially the same equivalent circuit as the first embodiment, this sixth embodiment can provide the same effect as that of the first embodiment.

Figure 12:
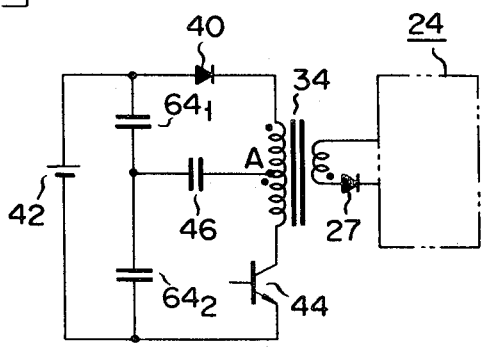

FIG. 12 shows a seventh embodiment of the invention which differs from the first embodiment of FIG. 4 in that a second circuit means is formed of first, second and third capacitors 46, $64_1$ and $64_2$, that a series circuit of the second and third capacitors $64_1$ and $64_2$ is connected across a d.c. power supply 42, and in that the first capacitor 46 is connected between the junction of the second and third capacitors $64_1$ and $64_2$ and a tap terminal A of a pulse transformer 34. The capacitances of the second and third capacitors $64_1$ and $64_2$ are great enough to prevent variation of the voltage at the junction even though a charging current flows through the first capacitor 46. Having substantially the same equivalent circuit as the first embodiment, this seventh embodiment can provide the same effect as that of the first embodiment.

Although a transistor is used as the switching element in the above-mentioned first to seventh embodiments, there may be used any other suitable switching elements, such as FET, GTO thyristor, SCR plus commutation circuit, etc. It is to be understood that various changes and modifications may be effected by one skilled in the art without departing from the scope or spirit of the invention.

What is claimed is:

1. A gate circuit of a gate turn-off thyristor comprising:

a first circuit means connected across the cathode and the gate of said gate turn-off thyristor for applying thereacross a pulse voltage with a high rate of increase and lower rate of decrease, said first circuit means including a DC power supply and a series circuit connected across said DC power supply, said series circuit being a substantially lossless series circuit, and including:

(a) a pulse transformer having first and second primary windings and a secondary winding, with said first primary winding be connected in series with, and magnetically closely coupled to, said second primary winding, (b) a rectifier circuit element connected in series with said secondary winding across the cathode and the gate of said thyristor to apply said pulse voltage, said rectifier circuit element connected with a polarity to conduct current from the gate to the cathode of said thyristor, (c) a diode connected in series with said primary windings of said transformer for preventing a reverse current from flowing into said DC power supply, and (d) a switching element connected in series with said primary windings of said transformer for switching on said series circuit when said thyristor is on so that said thyristor turns off;

a second circuit means connected to a junction between said first and second primary windings and one side of said power supply for charging at a low rate a large part of the exciting energy stored in said transformer by way of said first primary winding until the voltage across said second circuit means becomes large enough to bias said diode reversely when said switching element is switched off and for discharging at a high rate to produce a steeply rising edge pulse when said switching element is switched on.

2. A gate circuit of a gate turn-off thyristor according to claim 1, wherein said first primary winding has one end connected through said diode to a positive terminal of said power supply and a second end connected to one end of said second primary winding at said junction, said second primary winding having a second end connected through said switching element to a negative terminal of said power supply.

3. A gate circuit of gate turn-off thyristor according to claim 2, wherein said switching element comprises an NPN transistor having a collector connected to the second end of said second primary winding and an emitter connected to the negative terminal of said power supply.

4. A gate circuit of a gate turn-off thyristor according to claim 3, wherein said second circuit means comprises a capacitor connected between said junction of said first and second primary windings and the negative terminal of said power supply.

5. A gate circuit of a gate turn-off thyristor according to claim 3, wherein said second circuit means comprises a capacitor connected between said junction of said first and second primary windings and the positive terminal of said power supply.

6. A gate circuit of a gate turn-off thyristor according to claim 1, wherein:

said switching element comprises a PNP transistor having an emitter connected to a positive terminal of said power supply and a collector connected to one end of said first primary winding; and said second primary winding has one end connected to an anode of said diode, which has a cathode connected to a negative terminal of said power supply.

7. A gate circuit of a gate turn-off thyristor according to claim 6, wherein said second circuit means comprises:

a capacitor connected between the junction of said first and second primary windings and the negative terminal of said supply.

8. A gate circuit of a gate turn-off thyristor according to claim 1, wherein said first primary winding has one end connected to a positive terminal of said power supply and a second end connected to an anode of said diode, said second primary winding has one end connected at a junction to a cathode of said diode and a second end to one end of said switching element, and said switching element has a second end connected to a negative terminal of said power supply.

9. A gate circuit of a gate turn-off thyristor according to claim 8, wherein said second circuit means comprises:

a capacitor connected between the junction of the cathode of said diode and said second primary winding, and the negative terminal of said power supply.

10. A gate circuit of a gate turn-off thyristor according to claim 1, wherein said secondary winding is composed of part of said first primary winding.

11. A gate circuit of a gate turn-off thyristor according to claim 3, which further comprises:

a voltage dividing circuit connected across said power supply with said second circuit means connected between the junction of said first and second primary windings and a voltage dividing terminal of said voltage dividing circuit.

* * * * *